United States Patent
Cheng et al.

(10) Patent No.: US 12,424,560 B2
(45) Date of Patent: Sep. 23, 2025

(54) SEMICONDUCTOR CHIP DEVICE

(71) Applicant: Advanced Micro Devices, Inc., Santa Clara, CA (US)

(72) Inventors: Chia-Hao Cheng, Taichung (TW); Kong Toon Ng, Taichung (TW); Rahul Agarwal, Livermore, CA (US); Brett P. Wilkerson, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 946 days.

(21) Appl. No.: 17/644,191

(22) Filed: Dec. 14, 2021

(65) Prior Publication Data

US 2023/0187364 A1 Jun. 15, 2023

(51) Int. Cl.
*H01L 23/538* (2006.01)
*H01L 21/48* (2006.01)

(52) U.S. Cl.
CPC ........ *H01L 23/5384* (2013.01); *H01L 21/486* (2013.01)

(58) Field of Classification Search
CPC .................. H01L 23/5384; H01L 21/486
See application file for complete search history.

(56) References Cited

U.S. PATENT DOCUMENTS

| | | | |
|---|---|---|---|
| 7,727,887 B2 | 6/2010 | Christensen et al. | |
| 9,305,959 B2 | 4/2016 | Bhagavat et al. | |
| 9,368,450 B1* | 6/2016 | Gu | H01L 23/5385 |
| 10,510,721 B2 | 12/2019 | Bhagavat et al. | |
| 10,593,628 B2 | 3/2020 | Bhagavat et al. | |
| 10,923,430 B2 | 2/2021 | Lin et al. | |
| 2014/0070375 A1 | 3/2014 | Grivna | |
| 2018/0102311 A1* | 4/2018 | Shih | H01L 25/0655 |
| 2020/0043853 A1* | 2/2020 | Kim | H01L 23/16 |

OTHER PUBLICATIONS

Bauer, T. "High Density Through Wafer Via Technology," NXTI-Nanotech, vol. 3, pp. 116-119 (2007).
Vardaman, E. J., "#D Packaging and the Future of TSV," TechSearch International, Inc., 11 pages (2008).

* cited by examiner

*Primary Examiner* — Peniel M Gumedzoe
(74) *Attorney, Agent, or Firm* — Keith Taboada

(57) ABSTRACT

An embodiment of a semiconductor chip device can include a molding layer having a first side and a second side, an interconnect chip at least partially encased in the molding layer, the interconnect chip comprising a through substrate via (TSV) that extends through the interconnect chip, an insulating layer positioned on the first side of the molding layer, and a conductive structure that is positioned vertically below the interconnect chip and extends through the insulating layer, wherein the conductive structure is electrically coupled to the TSV.

20 Claims, 14 Drawing Sheets

SEMICONDUCTOR CHIP DEVICE

FIELD OF THE DISCLOSURE

The present disclosure relates to electronic devices including vias. More particularly, present embodiments relate to a semiconductor chip device and methods for manufacturing the same.

RELATED ART

A type of multi-chip module includes two semiconductor chips mounted side-by-side on a carrier substrate or in some cases on an interposer (so-called "2.5D") that is, in-turn, mounted on a carrier substrate. The semiconductor chips can be flip-chip mounted to the carrier substrate and interconnected thereto by respective pluralities of solder joints. The carrier substrate is provided with electrical pathways to provide input/output pathways for the semiconductor chips both for inter-chip power, ground and signal propagation as well as input/output from the interposer itself. The semiconductor chips can include respective underfill material layers to lessen the effects of differential thermal expansion due to differences in the coefficients of thermal expansion of the chips, the interposer and the solder joints.

One variant of 2.5D interposer-based multi-chip modules uses a silicon interposer with multiple internal conductive traces for interconnects between two chips mounted side-by-side on the interposer. The interposer is manufactured with multitudes of through substrate vias (TSVs) to provide pathways between the mounted chips and a package substrate upon which the interposer is mounted. The TSVs and traces are fabricated using large numbers of processing steps.

Another multi-chip module technology is two dimensional (2D) wafer-level fan-out (or 2D WLFO). The 2D WLFO technology is based on embedding die into a molded wafer, also called "wafer reconstitution." The molded wafer is processed through a standard wafer level processing flow to create the final integrated circuit assembly structure. The active surface of the dies are coplanar with the mold compound, allowing for the "fan-out" of conductive copper traces and solder ball pads into the molded area using redistribution layer (RDL) processing. Three dimensional (3D) WLFO extends the 2D technology into multi-chip stacking where a second package substrate is mounted on the 2D WLFO.

Some other designs use embedded interconnect bridges (EMIB). These are typically silicon bridge chips (but occasionally organic chiplets with top side only input/outputs) that are embedded in the upper reaches of a package substrate.

SUMMARY OF THE DESCRIBED EMBODIMENTS

In an aspect, a semiconductor chip device includes a first molding layer having a first side and a second side opposite the first side; an interconnect chip at least partially encased in the first molding layer, the interconnect chip comprising a first through substrate via (TSV) that extends through the interconnect chip; an insulating layer positioned on the first side of the first molding layer; and a first conductive structure that is positioned vertically below the interconnect chip and extends through the insulating layer, wherein the first conductive structure is electrically coupled to the first TSV.

In an embodiment, a first solder structure can be positioned vertically below the first conductive structure and electrically coupled to the first TSV.

In a further embodiment, an intermediate conductive structure can be positioned between the first solder structure and the first conductive structure, wherein the intermediate conductive structure electrically couples the first solder structure to the first conductive structure.

In another embodiment, a first semiconductor chip can be positioned vertically above the interconnect chip and proximate the second side of the interconnect chip; and a second solder structure positioned on a bottom-side of the first semiconductor chip and vertically above at least a portion of the interconnect chip such that the second solder structure is over the interconnect chip.

In a further embodiment, the first TSV, the first conductive structure, and the second solder structure are configured to transmit an electrical signal to or from the first semiconductor chip.

In a further embodiment, the electrical signal is a power signal, and the first TSV, the first conductive structure, and the second solder structure are configured to transmit the power signal to the first semiconductor chip.

In another embodiment, the interconnect chip further comprises a die attach film disposed between the insulating layer and the interconnect chip, and wherein the first conductive structure extends through the die attach film.

In yet another embodiment, the interconnect chip can include a second TSV that extends through the interconnect chip, wherein the second TSV is horizontally spaced away from the first TSV; and a second conductive structure that is positioned vertically below the interconnect chip and extends through the insulating layer, wherein the second conductive structure is electrically coupled to the second TSV, and wherein the second conductive structure is horizontally spaced away from the first conductive structure.

In a further embodiment, the semiconductor chip device can also include a first semiconductor chip with a second solder structure; and a second semiconductor chip with a third solder structure, wherein the first TSV, the first conductive structure, and the second solder structure are electrically coupled together and are configured to transmit a first electrical signal to or from the first semiconductor chip, and wherein the second TSV, the second conductive structure, and the third solder structure are electrically coupled together and are configured to transmit a second electrical signal to or from the second semiconductor chip.

In a further embodiment, a first solder structure can be positioned vertically below the first conductive structure and electrically coupled to the first TSV; and a second solder structure positioned vertically below the second conductive structure and electrically coupled to the second TSV.

In another aspect, a process of manufacturing a semiconductor chip device can include operations of depositing an insulating layer along a first side of an interconnect chip, wherein: the interconnect chip includes the first side and a second side opposite the first side, the interconnect chip includes a first TSV extending therethrough, and the first TSV is electrically coupled to a first semiconductor chip, wherein the first semiconductor chip is closer to the second side of the interconnect chip than to the first side of the interconnect chip. Also including operations of patterning the insulating layer to define a first opening that extends to the first TSV; and forming a first conductive structure within the first opening in the insulating layer, wherein the first conductive structure is electrically coupled to the first TSV.

In an embodiment the process can also include operations of forming a first solder structure electrically coupled to the first conductive structure, wherein the first conductive structure is disposed between the first TSV and the first solder structure.

In another embodiment, the interconnect chip can include a second TSV extending therethrough, the second TSV is electrically coupled to a second semiconductor chip, wherein the second semiconductor chip is closer to the second side of the interconnect chip than to the first side of the interconnect chip; and patterning the insulating layer can include patterning the insulating layer to define a second opening that extends to the second TSV; and the process can further include forming a second conductive structure within the second opening within the insulating layer, wherein the second conductive structure electrically couples the second TSV to the second semiconductor chip.

In yet another embodiment, attaching the first side of the interconnect chip can also include depositing a die attach film to the first side of the interconnect chip and then attaching the interconnect chip, via the die attach film, to the insulating layer.

In a further embodiment, the process can also include patterning the die attach film to define a first opening, wherein the forming the first conductive structure comprises forming the first conductive structure within the first opening of the die attach film.

In another embodiment, the insulating layer can include a third side and a fourth side that is opposite the third side, and wherein the process can also include patterning the insulating layer on the third side to define a second opening, wherein: the patterning the insulating layer to define the first opening is performed on the fourth side of the insulating layer, and the patterning of the insulating layer on the third side to define the second opening is performed prior to the patterning of the insulating layer on the fourth side to define the first opening.

In a further embodiment, forming a second conductive structure in the second opening prior to forming the first conductive structure in the first opening.

In a further embodiment, forming a second conductive structure in the second opening prior to patterning the insulating layer on the fourth side to define the first opening.

In a further embodiment, the insulating layer can include a photoimageable polymer, and the second opening being formed by a photoimaging process and the first opening being formed by laser drilling or plasma etching.

In a further embodiment, the second opening can include a first width at the third side of the insulating layer and a second width at the fourth side of the insulating layer, the first opening including a third width at the fourth side of the insulating layer and a fourth width at the third side of the insulating layer, where the first width is larger than the second width, and the third width is larger than the fourth width.

BRIEF DESCRIPTION OF THE DRAWINGS

Embodiments are illustrated by way of example and are not limited in the accompanying figures.

Figure 1:
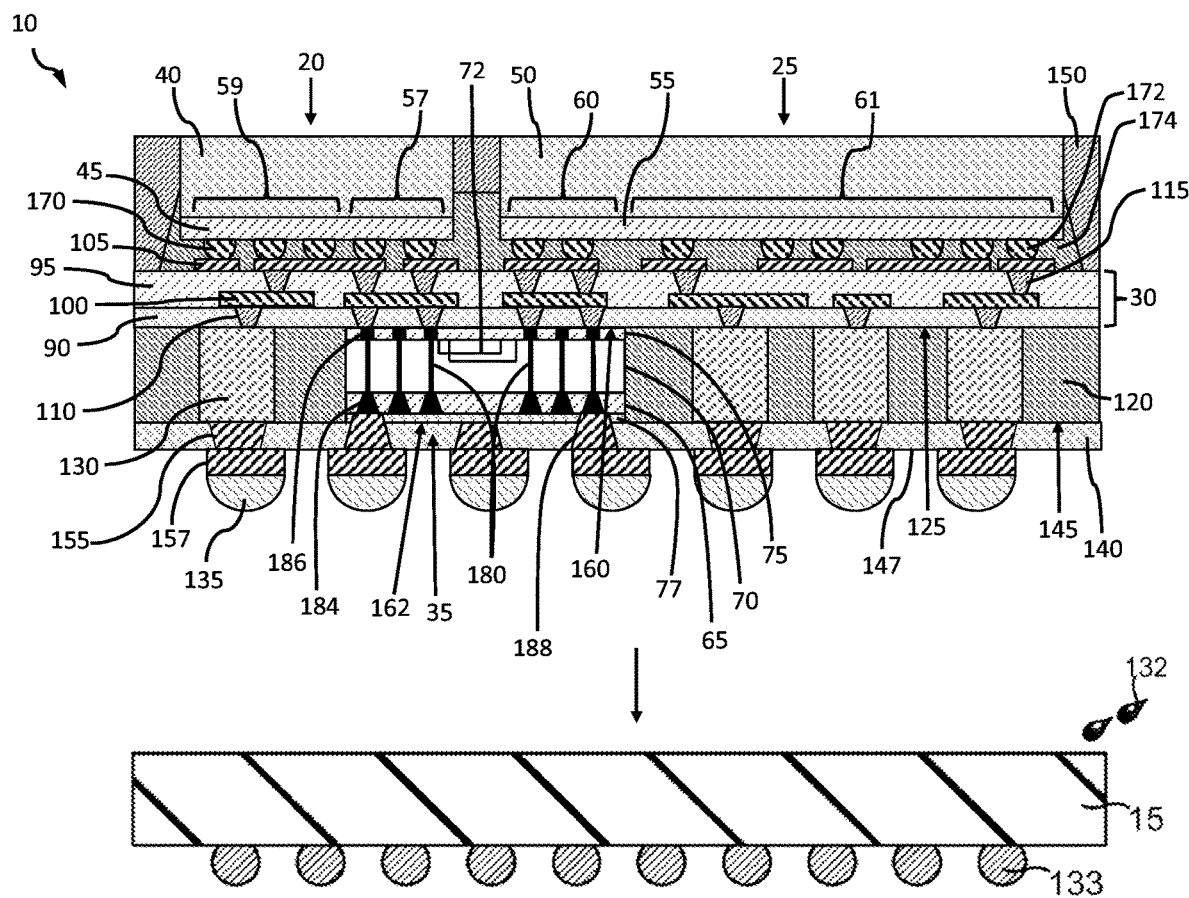
FIG. 1 is a representative cross-sectional view of a semiconductor chip device with an interconnect chip but shown exploded from an exemplary circuit board, according to a certain embodiment.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

The term "electrically coupled" is intended to mean a connection, linking, or association of two or more electronic components, circuits, systems, or any combination of: (1) at least one electronic component, (2) at least one circuit, or (3) at least one system in such a way that a signal (e.g., current, voltage, or optical signal) may be partially or completely transferred from one to another. A non-limiting example of "electrically coupled" can include an electrical connection between two electronic components. In a circuit diagram, a node corresponds to an electrical connection between the electronic components. Thus, an electrical connection is a specific type of electrical coupling; however, not all electrical couplings are electrical connections. Other types of electrical coupling include capacitive coupling, resistive coupling, and inductive coupling.

Unless explicitly stated to the contrary, the terms "horizontal," "lateral," and their variants are in a direction parallel to a primary surface of a substrate or semiconductor layer, and the terms "vertical" and its variants are in a direction perpendicular to a primary surface of a substrate or a semiconductor layer.

The terms "on," "overlying," "overlap," "overlapping," "overlaps," and "over" may be used to indicate that two or more elements are in direct physical contact with each other. However, "over" may also mean that two or more elements are not in direct contact with each other. For example, "over" may mean that one element is above another element, but the elements do not contact each other and may have another element or elements in between the two elements.

The terms "comprises," "comprising," "includes," "including," "has," "having," or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read such that the plurals include one or at least one and the singular also includes the plural, unless it is clear that it is meant otherwise. For example, when a single item is described herein, more than one item may be used in place of a single item. Similarly, where more than one item is described herein, a single item may be substituted for that more than one item.

The use of the word "about," "approximately," or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described. When values of a parameter are significantly different, such values are more than 10% different (and more than 20% different for semiconductor doping concentrations). When values of a parameter are different (e.g., less than, greater than, a numerical difference between values, or the like), without being modified by significantly or insignificantly, any difference beyond manufacturing tolerances for commercial production are considered different.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and microelectronic arts.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a semiconductor chip device that can include a first molding layer having first and second sides; an interconnect chip at least partially encased in the first molding layer, where the interconnect chip may include a first through substrate via (TSV) that extends through the interconnect chip; an insulating layer positioned on the first side of the first molding layer; and a first conductive structure that is positioned vertically below the interconnect chip and extends through the insulating layer, where the first conductive structure is electrically coupled to the first TSV.

One general aspect can include a process of manufacturing a semiconductor chip device that can include operations of depositing an insulating layer along a first side of an interconnect chip, where: the interconnect chip includes the first side and a second side opposite the first side, the interconnect chip includes a first TSV extending therethrough, and the first TSV is electrically coupled to a first semiconductor chip, where the first semiconductor chip is closer to the second side of the interconnect chip than to the first side of the interconnect chip. The process can also include patterning the insulating layer to define a first opening that extends to the first TSV; and forming a first conductive structure within the first opening in the insulating layer, where the first conductive structure is electrically coupled to the first TSV. Other embodiments of this aspect include corresponding computer systems, apparatus, and computer programs recorded on one or more computer storage devices, each configured to perform the actions of the methods.

In the drawings described below, reference numerals are generally repeated where identical elements appear in more than one figure. Turning now to the drawings, and in particular to FIG. 1, an exemplary semiconductor chip device 10 can be mounted on another device such as a circuit board 15. As described in more detail below, the semiconductor chip device 10 can be constructed using a die-last type process flow. The semiconductor chip device 10 can include two or more semiconductor chips 20 and 25 that are mounted on and electrically interconnected by a RDL structure 30 and an interconnect chip 35.

The semiconductor chips 20 and 25 can be any of a variety of integrated circuits. A non-exhaustive list of examples includes microprocessors, graphics processing units, or application processing units that combines aspects of both, memory devices, an application specific integrated circuit or other field programmable gate array. The semiconductor chips 20 and 25 can be the same type of integrated circuit or different types of integrated circuits. The semiconductor chip 20 can include a substrate portion 40 and an interconnect portion 45. The substrate portion 40 can include multitudes of logic and other circuits, can include silicon, germanium, or other types of semiconductor material, and can include one or more dielectric material. The interconnect portion 45 can consist of one or more layers of metallization and interlevel dielectric material. The semiconductor chip 25 similarly consists of a substrate portion 50 and an interconnect portion 55.

One of more semiconductor chips 20 may be constructed with a region 57, which can have various internal and external conductive structures dedicated to the transmission of one or more chip-to-chip signals, and a region 59, which has one or more conductive structures that are tailored more to the conveyance of power and ground or chip-to-circuit board signals. Other semiconductor chips 25 can similarly include a region 60 and a region 61 that can have similar functions as the region 57 and the region 59 of the one or more semiconductor chips 20.

However, using the techniques of the current disclosure, designers are allowed easier access to use both regions in both semiconductor chips 20, 25 for either power, ground, chip-to-chip, or chip-to-circuit board signals. Therefore, this removes design restrictions for a designer of a semiconductor chip device 10 as well as for a designer of the semiconductor chips 20, 25 to utilize any region of the semiconductor chips 20, 25 for all signal types, especially allowing vertical delivery of power from a circuit board 15 to the semiconductor chips 20, 25 through a vertical or near vertical stack of conductive structures (e.g., vias, traces, studs, etc.).

As noted briefly above, the semiconductor chips 20 and 25 are connected electrically by way of another semiconductor chip, namely, an interconnect chip 35. The interconnect chip 35 includes an interconnect portion 70 that can include a substrate portion and an interconnect portion like the corresponding portions of the semiconductor chips 20 and 25. The semiconductor chips 20 and 25 and the interconnect chip 35 can be constructed of silicon, germanium or another semiconductor material and can be bulk semiconductor, semiconductor on insulator or another design. The interconnect chip 35 can include one or more conductive traces 72, which can be on one or more levels as desired. The conductive trace 72 can interface electrically with one or more conductive structures of the regions 57 and 60 of the semiconductor chips 20 and 25 by way of one or more conducting pathways. The interconnect portions 45, 55 and 70 of the semiconductor chips 20 and 25 and the interconnect chip 35, respectively, can have outermost passivation structures (not visible) that can be a laminate of various insulating materials such as, silicon oxides, silicon nitride, or other dielectric materials. An electrically insulating layer, such as insulating layers 65, 75, and 140, can include epoxy resins, a polyimide, or another polymer.

An insulating layer 75 can be deposited on the interconnect portion 70 of the interconnect chip 35. The one or more conductive traces 72 of the interconnect chip 35 can be electrically connected to the RDL structure 30 by one or more copper studs 186 in the insulating layer 75 that extend from the interconnect portion 70 to the RDL structure 30. These one or more copper studs 186 can provide vertical interconnection for lateral traces in the interconnection layer 70 as well as connection to one or more TSVs 180. An insulating layer 65 can be positioned on an opposite side of the interconnect portion 70 to form vias 184 for electrically coupling the TSVs to solder structures 135. In this illustrative arrangement, the insulating layer 75 can be used for lateral routing in addition to the vertical connections of the studs 186. A die attach film 77 (or non-conductive film NCF) is positioned below the insulating layer 65 of the interconnect chip 35 and attaches the interconnect chip 35 to the insulating layer 140 during fabrication of the semiconductor chip device 10.

As used herein, "conductive structure" refers to a metal structure configured for transmission of electrical current, which can include vias, traces, conductive pillars, conductive pads, solder structures, or conductive studs. Therefore, a via, a trace, a conductive pillar, a conductive pad, a solder structure, or a conductive stud described in this disclosure can also be referred to as a conductive structure.

The RDL structure 30 includes one or more dielectric layers, two of which are shown in this illustrative arrangement and numbered 90 and 95, respectively, and various conductive structures, such as vias and traces. For example, the RDL structure 30 can include a single metallization layer, such as metallization layer 105, without dielectric layers 90, 90 or metallization layer 100. The metallization layer 105 can be etched to form appropriate traces to electrically couple the TSVs with respective ones of the solder structures 170, 172 under the semiconductor chips 20, 25.

Alternatively, or in addition, the RDL structure 30 can include more or fewer dielectric layers than those shown, as well as more or fewer metallization layers. In a certain embodiment, the dielectric layers 90 and 95 and the metallization layers 100, 105 can form the RDL structure 30. The dielectric layers 90 and 95 are preferably composed of polybenzoxazoles, although another polymeric material could be used, such as benzocyclobutene, polyimide or another polymer. Since the RDL structure 30 is fabricated before the chips 20 and 25 are mounted thereon, polymer curing temperatures above 200° C. can be used. The dielectric layers 90 and 95 are designed to act as stress buffers and isolation films and to enable redistribution layer routing.

For example, the RDL structure 30 includes a metallization layer of one or more conductive pads/traces 100 can be fabricated on the dielectric layer 90 and another metallization layer of one or more conductive pads/traces 105 can be fabricated on the dielectric layer 95. The pads/traces 100 and 105 convey power, ground or signals. One or more conductive vias 110 can be interspersed in the dielectric layer 90 to connect the pads/traces 100 to underlying conductors, such as the conductive studs 186. One or more vias 115 can be interspersed in the dielectric layer 95 to connect the pads/traces 100 to overlying conductors, such as the pads/traces 105. The pads/traces 105 can be fabricated with design rules for small spacings associated with the I/O mappings of the chips 20 and 25.

The interconnect chip 35 and the insulating layer 75 can be at least partially encased in a molding layer 120. The RDL structure 30 is fabricated on a side 125 of the molding layer 120. One or more conductive pillars 130 are positioned in the molding layer 120. The conductive pillars 130 are connected to the RDL structure 30 by way of the vias 110 and to the circuit board 15 by way of the vias 155, conductive pads 157, and solder structures 135. The conductive pad 157 can be referred to as intermediate conductive structure that is electrically coupled to a respective solder structure 135 and vias 188, 155. The solder structures 135 can be bumps, balls or the like. An insulating layer 140 is fabricated on a side 145 of the molding layer 120. The insulating layer 140 is capable of being laser drilled or etched to form openings to accommodate the vias 155 as well as the vias 188. The insulating layer 140 can comprise a photoimageable material that can be processed via a photoimaging process to form one or more openings in the insulating layer 140 in which a conductive structure can be formed in each opening. Material for the insulating layer can include a polybenzoxazole, or a polymeric material such as benzocyclobutene, polyimide, or another polymer, or glass.

Note that the conductive pillars 130, the vias 155, the vias 188, the conductive pads 157, and the solder structures 135 are fabricated with different design rules than the pads/traces 100 and 105 and vias 110 and 115 of the RDL structure 30 and thus can be quite a bit larger than those structures. However, the RDL structure 30 can provide a size transition interconnect system between the relatively large conductive pillars 130 and the much smaller interconnects associated with the semiconductor chips 20 and 25. In this regard, the semiconductor chip 20, and in particular the interconnect portion 45 thereof, is connected to the pads/traces 105 directly or by way of one or more solder structures 170, which can be solder bumps, micro bumps, metal pillars or others. The chip 25, and in particular the interconnect portion 55 thereof, is similarly connected to various of the pads/traces 105 by way of one or more solder structures 172, which can be like the solder structures 170.

It is desirable for the one or more materials selected for the molding layers 120 and 150 to exhibit suitable viscosity at the applicable molding temperatures and have molding temperatures lower than the melting points of any of the solder structures present at the time of the molding processes. In a certain embodiment, the one or more materials for the molding layers 120 and 150 can have a molding temperature of about 165° C. Two commercial variants are Sumitomo EME-G750 and G760. To cushion against the effects of mismatched coefficients of thermal expansion, an underfill material 174 can be positioned between the semiconductor chips 20 and 25 and the RDL structure 30 and can extend laterally beyond the left and right edges (and those edges not visible) of the chips 20 and 25 as desired. The underfill material 174 can be composed of one or more polymeric underfill materials, such as one or more epoxies or others.

The one or more conductive structures of the RDL structure 30, the one or more conductive structures of the interconnect portion 70, and the one or more conductive structures of the insulating layer 75 and other conductors disclosed herein can be composed of various conductive materials, such as copper, aluminum, silver, gold, platinum, palladium, laminates of these or one or more others. The solder structures 135 and the solder structures 170 and 172 and other solder structures disclosed herein can be composed of various solder compositions, such as tin-silver, tin-silver-copper or one or more others.

None of the arrangements disclosed herein is reliant on particular functionalities of the semiconductor chips 20 and 25 or the circuit board 15. Thus, the semiconductor chips 20 and 25 can be any of a variety of different types of circuit devices used in electronics, such as, for example, interposer, microprocessor, graphics processor, combined microprocessor/graphics processor, application specific integrated circuit, field programmable logic arrays, memory device or the like, and can be single or multi-core. The semiconductor chips 20 and 25 can be constructed of bulk semiconductor, such as silicon or germanium, or semiconductor-on-insulator materials, such as one or more silicon-on-insulator materials or even one or more insulator materials. Thus, the term "semiconductor chip" even contemplates one or more insulating materials. Stacked dice can be used if desired.

The circuit board 15 can be organic or ceramic and single, or more commonly, multilayer. Variations can include package substrates, system boards, daughter boards, circuit cards and others. To cushion against the effects of mismatched coefficients of thermal expansion, an underfill material 132 can be positioned between the insulating layer 140 and the upper surface of the circuit board 15 and can extend laterally beyond the left and right edges (and those edges not visible) of the molding layer 120 as desired. The underfill material 132 can be composed of one or more polymeric underfill materials. The circuit board 15 can include I/Os 133 to interface with another device (not shown). The I/Os 133 can be solder balls or bumps, pins or others.

Figure 2:
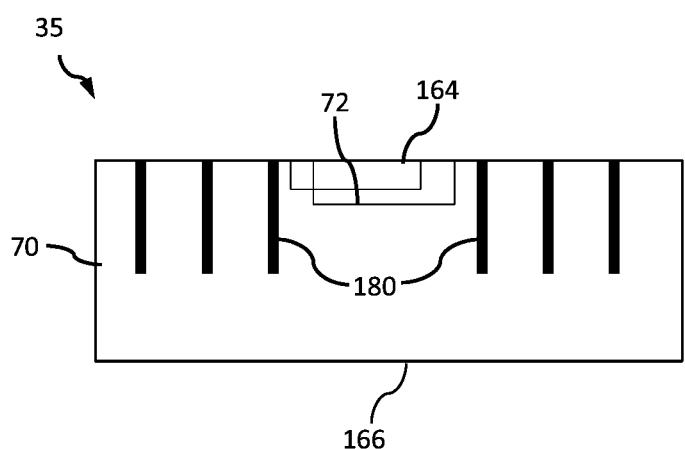
FIG. 2 is a representative cross-sectional view of an interconnect chip substrate with through substrate vias (TSVs) and conductive traces included therein, according to a certain embodiment.

An exemplary process flow for fabricating the semiconductor chip device 10 can be understood by referring now to FIGS. 2 to 22 and initially to FIG. 2. The fabrication process entails a process to fabricate the interconnect chip 35 (FIGS.

2-7) and a process to fabricate the semiconductor chip device 10 containing the interconnect chip 35 (FIGS. 8-22).

FIG. 2 is a sectional view depicting a portion of an interconnect chip 35 which can be fabricated separately, or it can be singulated from a semiconductor wafer from which many of interconnect chips 35 can be fabricated on a wafer level basis. Initially, the various circuit structures that may be located in the interconnect portion 70 can be fabricated using processes for fabricating integrated circuits in semiconductor materials. The circuit structures can include through substrate vias (TSVs) 180 that extend vertically through a portion of the interconnect portion 70 with ends of the TSVs exposed at the top surface 164 of the interconnect portion 70. This can entail dielectric deposition patterning and patterning processes such as CVD and metallization deposition and patterning processes in order to form the various conductive traces 72 and TSVs 180. Alternatively, there may be no conductive traces 72 in the interconnect portion 70.

Figure 3:
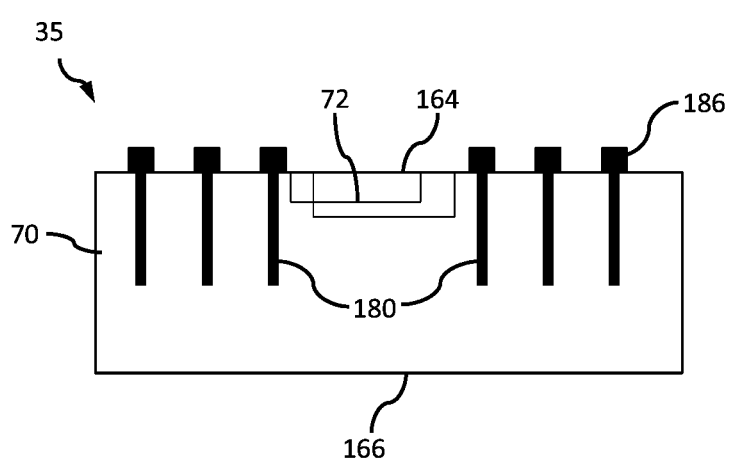
FIG. 3 is a representative cross-sectional view of the interconnect chip substrate of FIG. 2 with conductive studs formed on one or more TSVs, according to a certain embodiment.

Next as shown in FIG. 3, conductive studs 186 can be formed above each of the TSVs 180 in the interconnect portion 70 of the interconnect chip 35. This may entail processes for forming the conductive studs 186 above the TSVs 180 and electrically coupling to the TSVs 180, such as depositing a seed layer, masking the seed layer to build the studs at the desired positions, depositing metal (e.g., plating) to build the studs at the desired locations, and then etching away the exposed seed layer portions.

Figure 4:
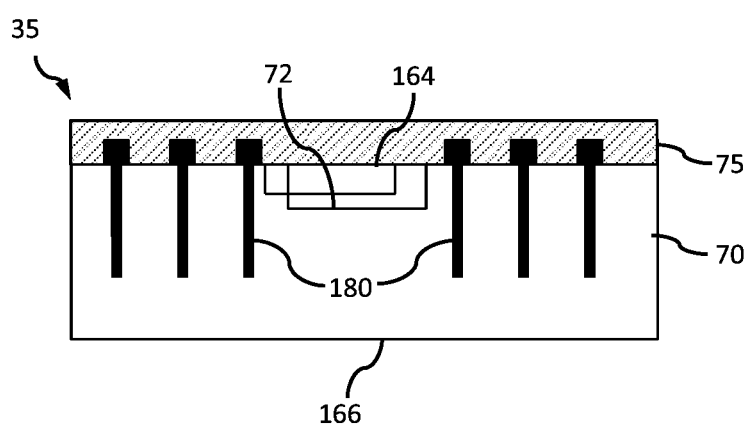
FIG. 4 is a representative cross-sectional view of the interconnect chip substrate of FIG. 3 with an insulating layer covering the conductive studs, according to a certain embodiment.

Next and as shown in FIG. 4, the insulating layer 75 is deposited over the conductive studs 186 and the otherwise exposed portions of the interconnect portion 70. Note that the insulating layer 75 is deposited with a thickness that is greater than the height of the conductive studs 186. As described in more detail below, a subsequent grinding process will ultimately reveal the tops of the conductive studs 186.

Figure 5:
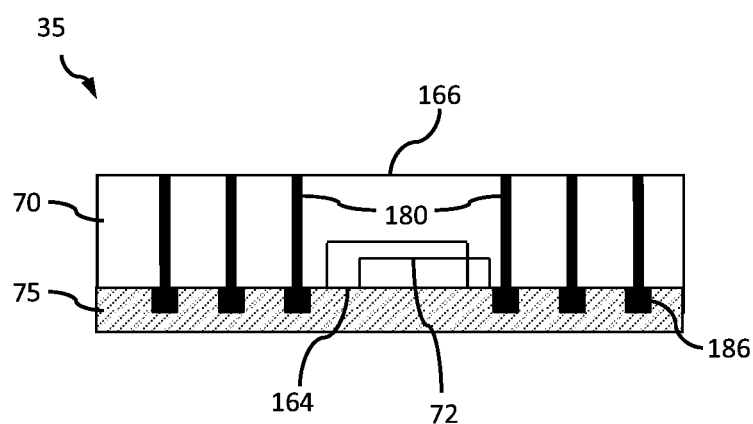
FIG. 5 is a representative cross-sectional view of the interconnect chip substrate of FIG. 4 after grinding exposes an end of the TSVs, according to a certain embodiment.

Next and as shown in FIG. 5, the interconnect portion 70 with the conductive studs 186 undergoes a thinning process, by CMP or grinding or the like of surface 166, in order to reduce the thickness of the interconnect chip 35 to the thickness that it takes on just prior to mounting with the conductive pillars 130 and to expose the ends of the TSVs 180 at the surface 166. The insulating layer 75 remains in place and with the initial deposited thickness depicted in FIG. 5 as well.

Figure 6:
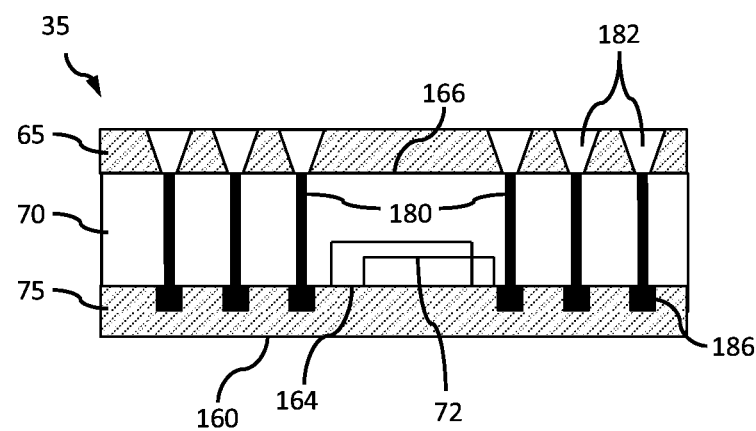
FIG. 6 is a representative cross-sectional view of the interconnect chip substrate of FIG. 5 with an insulating layer deposited over the exposed ends of the TSVs and openings in the insulating layer above one or more of the TSVs, according to a certain embodiment.

Next and as shown in FIG. 6, the insulating layer 65 is deposited on the surface 166 over the exposed ends of the TSVs 180 and the otherwise exposed portions of the surface 166. Openings 182 can be formed in the insulating layer 65 to expose the ends of the TSVs 180 at the surface 166. The insulating layer 65 can be infused with photoactive compounds in order to be able to form openings for the subsequently plated vias 184. Optionally, openings 182 for the subsequently formed vias 184 can be formed by laser drilling or other types of etching techniques.

Figure 7:
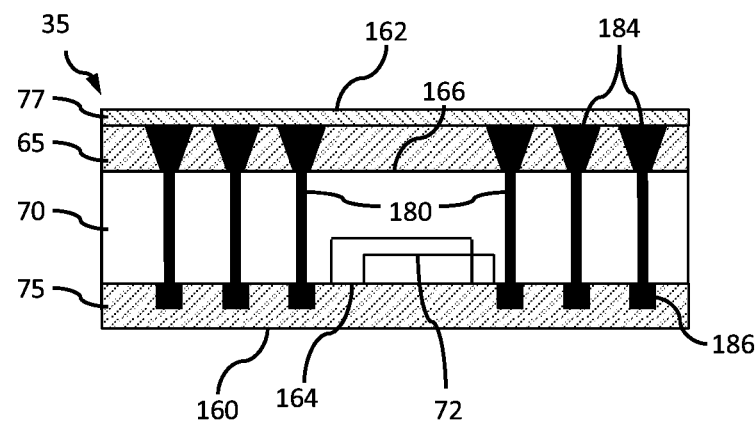
FIG. 7 is a representative cross-sectional view of the interconnect chip substrate of FIG. 6 with metal deposited in each of the openings to form vias above the TSVs and a die attach film deposited above the vias, according to a certain embodiment.

Next and as shown in FIG. 7, following formation of the openings 182, the vias 184 are fabricated using plating or other material deposition techniques. Then a die attach film 77 is deposited on the insulating layer 65 and overlying the vias 184. The die attach film 77 can be composed of epoxy adhesives or other die attach film materials. The die attach film 77 will be used later in the process to attach the interconnect chip 35 to an insulating layer 140 of the semiconductor chip device 10. The interconnect chip 35 as seen in FIG. 7 has a surface 162 (which can be referred to as a bottom surface 162) and a surface 160 (which can be referred to a top surface 160). Please note that the interconnect chip of FIG. 7 is flipped over before assembly into the semiconductor chip device 10.

Figure 8:
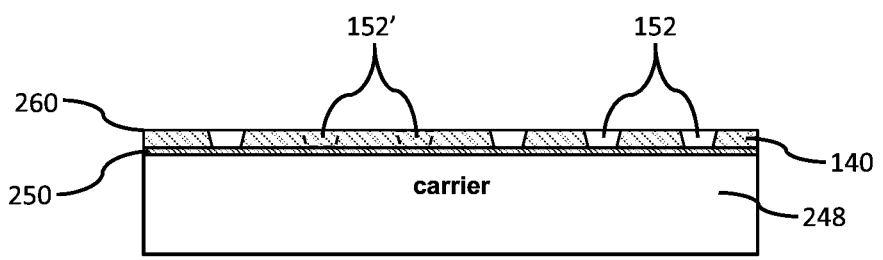
FIG. 8 is a representative cross-sectional view of a carrier attached, via a release layer, to a portion of a semiconductor chip device, the portion including an insulating layer with openings for forming vias, according to a certain embodiment.

FIG. 8 is a representative cross-sectional view of a carrier 248 coupled, via a release layer 250, to an insulating layer 140 with one or more openings 152 formed therein. A Light-To-Heat-Conversion Release Coating (LTHC) ink can be deposited on the carrier 248 via a spin coating or ink jet printing technique to form the release layer 250. The openings 152 for the subsequently formed vias 155 can be formed by laser drilling or other types of etching techniques. Optionally, or in addition, the insulating layer 140 can comprise a photoimageable polymer that can be processed via a photoimaging process to form the one or more openings 152, 152' in the insulating layer 140 in which a conductive structure (e.g., via 155) can be formed in each opening.

Figure 9:
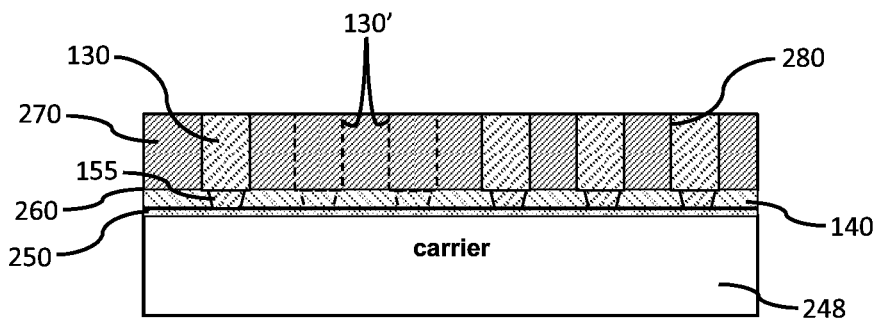
FIG. 9 is a representative cross-sectional view of a carrier attached to a portion of a semiconductor chip device, the portion including an insulating layer with vias formed therein and conductive pillars formed above the vias, according to a certain embodiment.

Next as shown in FIG. 9, following formation of the openings 152, the vias 155 are fabricated using plating or other material deposition techniques. Note that some of the openings 152 are shown in section, but others, such as those deeper into the page than the interconnect chip 35 (e.g., openings 152'), are obscured and are indicated with dashed lines. A photolithography mask 270 can be deposited on the plating seed layer 260 and patterned photolithographically to produce one or more openings 280, which can be used to define the one or more conductive pillars 130. The photolithography mask 270 can be composed of negative tone or positive tone resist as desired. For simplicity of illustration, the plating seed layer 260 may not be shown in some figures.

Then, with the photolithography mask 270 in place and patterned, a plating process is performed to fabricate the one or more conductive pillars 130. The plating process is preferably a biased plating process. Next, the photolithography mask 270 can be stripped using ashing, solvent stripping or the like to yield the one or more conductive pillars 130 positioned on the insulating layer 140. Portions of the plating seed layer 260 on the insulating layer 140 lateral to the pillars 130 are etched using etch techniques. Note that some of the conductive pillars 130 are shown in section, but others, such as those deeper into the page than the interconnect chip 35 (e.g., pillars 130'), are obscured and are indicated with dashed lines.

Figure 10:
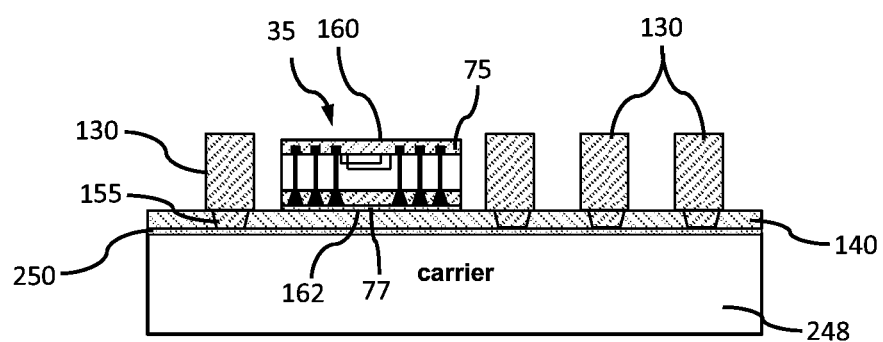
FIG. 10 is a representative cross-sectional view of the assembly of FIG. 9 with an interconnect chip attached to the insulating layer, according to a certain embodiment.

Next and as shown in FIG. 10, the interconnect chip 35 is attached to the insulating layer 140 via the die attach film 77 such that the bottom surface 162 of the interconnect chip 35 is proximate the insulating layer 140 and the top surface of the interconnect chip 35 is spaced away from the insulating layer 140. This can also be seen as depositing the insulating layer 140 on the side 162 of the interconnect chip 35. Please note that the conductive pillars 130' and associated openings 152' are not shown for clarity, but they may remain in the construction of the semiconductor chip device 10. The combination of the carrier wafer 248, the one or more conductive pillars 130 and the interconnect chip 35 undergo a thermal curing process in order to fix the die attach film 77 to the insulating layer 140. The die attach film 77 needs to be robust enough to hold the interconnect chip 35 in position during a subsequent encapsulating molding process.

Figure 11:
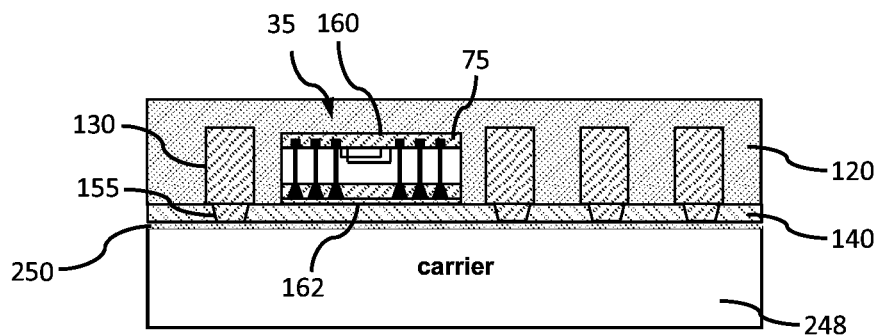
FIG. 11 is a representative cross-sectional view of the assembly of FIG. 10 with a molding layer encapsulating the interconnect chip and the conductive pillars, according to a certain embodiment.

Next and as shown in FIG. 11, the molding layer 120 is formed over the interconnect chip 35 and the conductive pillars 130 and the otherwise exposed portions of the insulating layer 140. The molding layer 120 can be formed using compression molding techniques. The other depicted structures remain attached to the carrier wafer 248 during this process.

Figure 12:
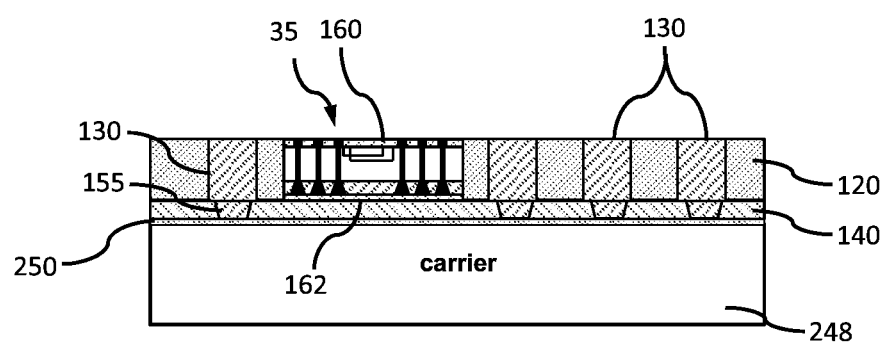
FIG. 12 is a representative cross-sectional view of the assembly of FIG. 11 after a grinding process has exposed the ends of the conductive studs of the interconnect chip and the conductive pillars, according to a certain embodiment.

Next and as shown in FIG. 12, the molding layer 120 can undergo a grinding process to expose the conductive pillars 130. In addition, the grinding process thins the insulating layer 75 so that the formerly covered conductive studs 186 of the interconnect chip 35 are also exposed. It is necessary to expose these various conductive structures in order to allow electrical connections between the subsequently formed vias 110 (or metallization 105), respective pillars 130, and conductive studs 186.

Figure 13:
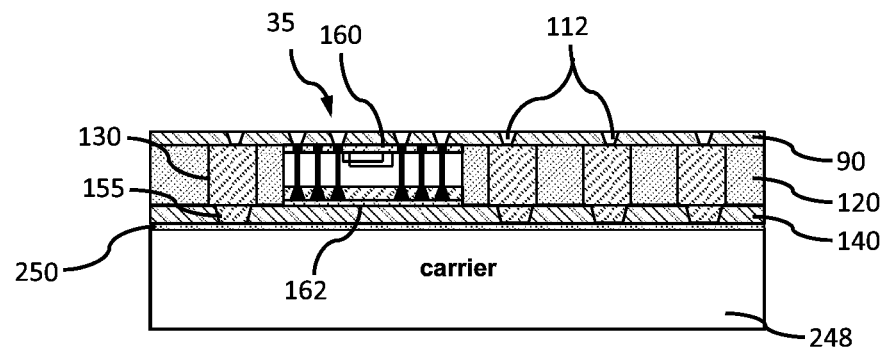
FIG. 13 is a representative cross-sectional view of the assembly of FIG. 12 with an insulating layer deposited on the assembly having openings formed therein, according to a certain embodiment.

The fabrication of the RDL structure 30 will now be described in conjunction with FIGS. 13, 14, 15 and 16. Referring first to FIG. 13, the dielectric layer 90 is initially deposited on the molding layer 120 and over the otherwise exposed pillars 130 and the conductive studs 186. The dielectric layer 90 can be deposited using spin coating and baking techniques and can be infused with photoactive compounds in order to be able to form openings 112 for the subsequently plated vias 110. Optionally, openings 112 for the subsequently formed vias 110 can be formed by laser drilling or other types of etching techniques. Following formation of the openings 112, the vias 110 are fabricated using plating or other material deposition techniques. The carrier wafer 248 remains during these steps.

Figure 14:
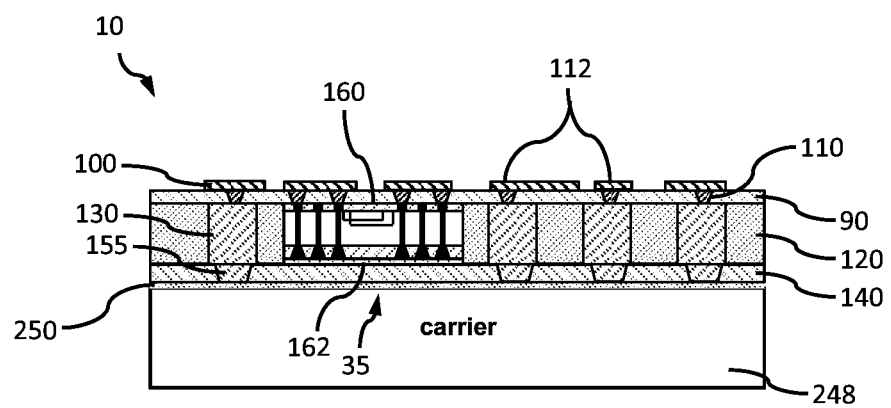
FIG. 14 is a representative cross-sectional view of the assembly of FIG. 13 with a metallization layer deposited over the insulating layer and filling the openings to form vias, according to a certain embodiment.

Next and as shown in FIG. 14, the metallization layer 100 is fabricated on the dielectric layer 90. The metallization layer 100 can be an additive or subtractive process. In certain embodiment, the metallization layer 100 is fabricated as a subtractive process in which a blanket layer of metallic material is deposited using PVD or CVD techniques and then subsequently etched to define the individual conductive traces of the metallization layer 100. The carrier wafer 248 remains during these steps.

Figure 15:
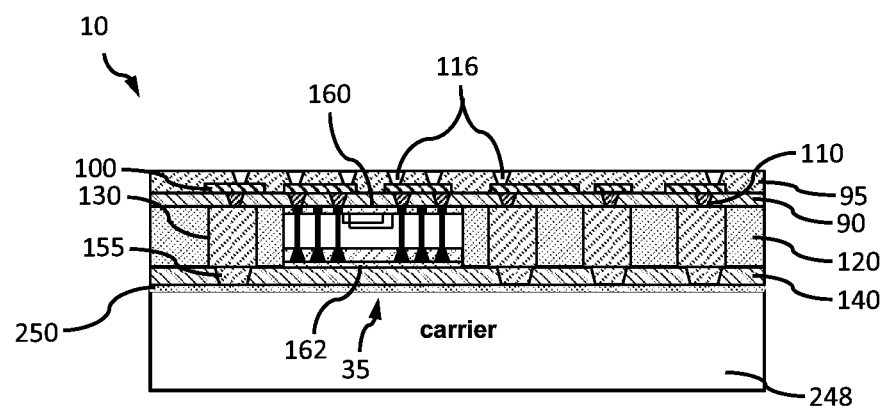
FIG. 15 is a representative cross-sectional view of the assembly of FIG. 14 with another insulating layer deposited on the assembly having openings formed therein, according to a certain embodiment.

Next and as shown in FIG. 15, the dielectric layer 95 is deposited over the metallization layer 100 and the exposed portions of the dielectric layer 90. As with the dielectric layer 90, the dielectric layer 95 is processed in order to form openings 116 for the subsequently formed vias 115. As with the dielectric layer 90, the formation of these openings 116 for the vias 115 can be by way of laser drilling, photolithography using photoactive compounds for the dielectric layer 95 or other techniques. Subsequently, the vias 115 are formed in the openings 116 using the techniques described above for the vias 110. The carrier wafer 248 remains during these steps.

Figure 16:
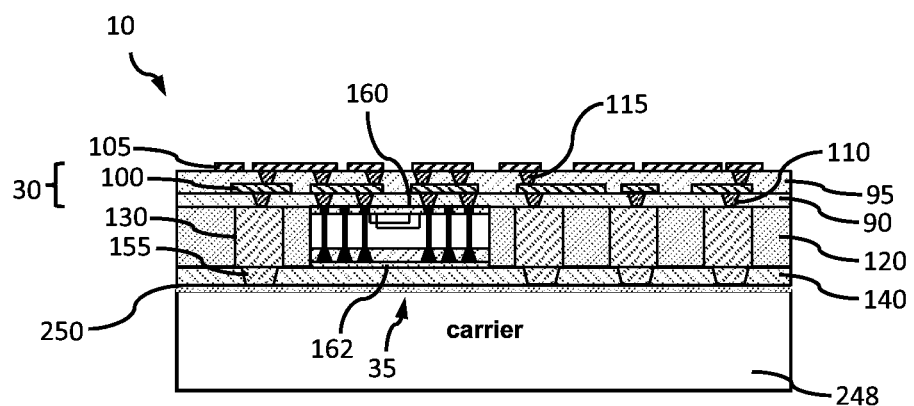
FIG. 16 is a representative cross-sectional view of the assembly of FIG. 15 with another metallization layer deposited over the other insulating layer and filling the openings to form vias forming the redistribution layer (RDL), according to a certain embodiment.

Next and as shown in FIG. 16, the metallization layer 105 is fabricated on the dielectric layer 95 and in ohmic contact with various of the vias 115. Again, this process may be an additive or subtractive process. In a certain embodiment, the metallization layer 105 is fabricated using the same techniques described above for the metallization layer 100.

Figure 17:
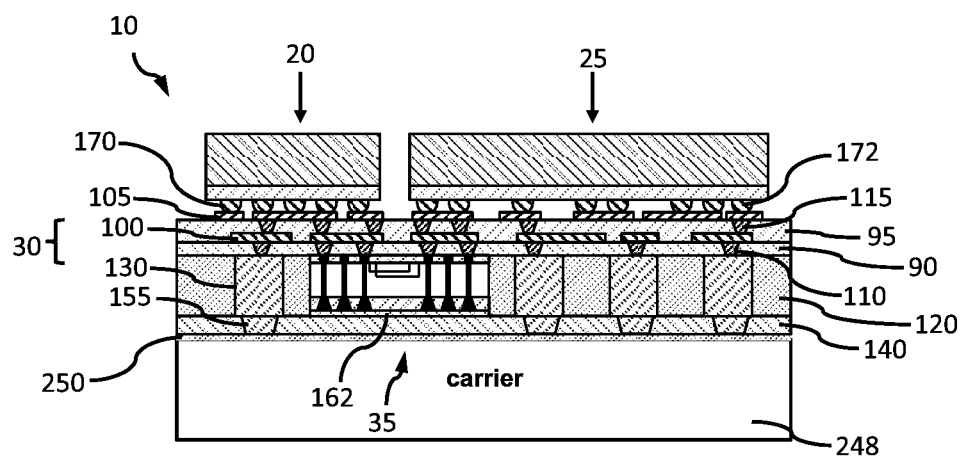
FIG. 17 is a representative cross-sectional view of the assembly of FIG. 16 with semiconductor chips flip-chip mounted to the RDL, according to a certain embodiment.

Next and as shown in FIG. 17, the semiconductor chips 20 and 25 can be flip-chip mounted on the metallization layer 105 and secured thereto both mechanically and electrically by way of the respective solder structures 170 and 172, this process will typically entail a reflow process in order to temporarily liquefy the solder structures 170 and 172. The semiconductor chips 20 and 25 are preferably verified as known good die prior to mounting.

Figure 18A:
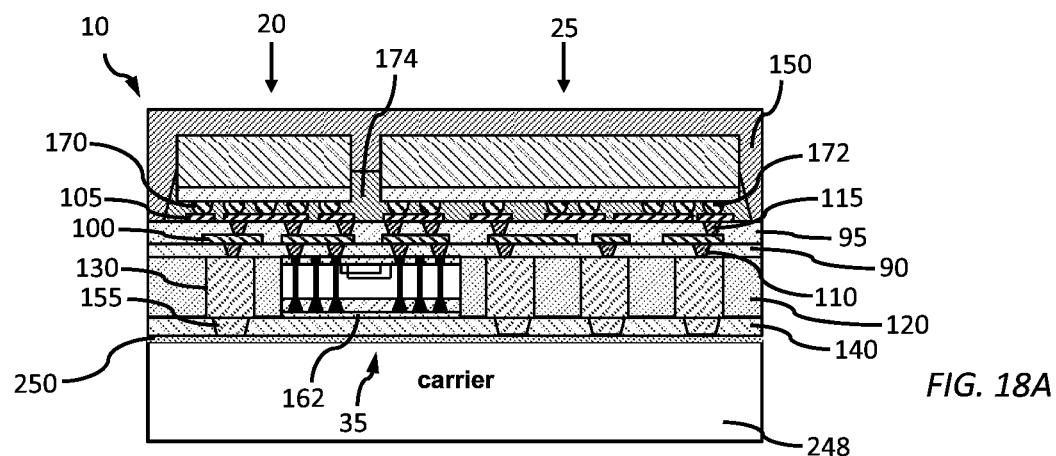
FIGS. 18A and 18B are representative cross-sectional views of the assembly of FIG. 17 with an underfill material added and a molding layer encapsulating the semiconductor chips, according to a certain embodiment.

Next and as shown in FIG. 18A, the underfill material 174 can be positioned between the chips 20 and 25 and the RDL structure 30. The underfill material 174 can be capillary or molded. It can also be possible to pre-apply the underfill material 174 and drop the chips 20 and 25 down onto the metallization layer 105. The carrier wafer 248 remains during these steps. Next and still referring to FIG. 18A, the molding layer 150 is formed over the semiconductor chips 20 and 25 to at least partially encase those chips and the otherwise exposed portions of the RDL structure 30. The molding can be performed by compression molding techniques.

Figure 18B:
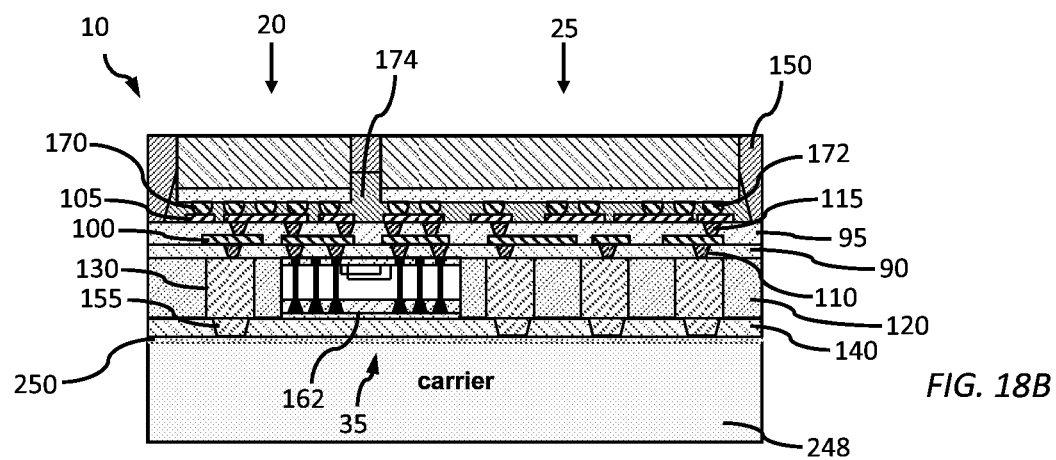

Next and as shown in FIG. 18B, the molding layer 150 can be subjected to a grinding process to expose the upper surfaces of the chips 20 and 25 prior to the eventual mounting of some form of heat spreader or sink thereon. In addition, the carrier wafer 248 depicted in FIG. 18A is removed by deactivating the release layer 250.

Figure 19A:
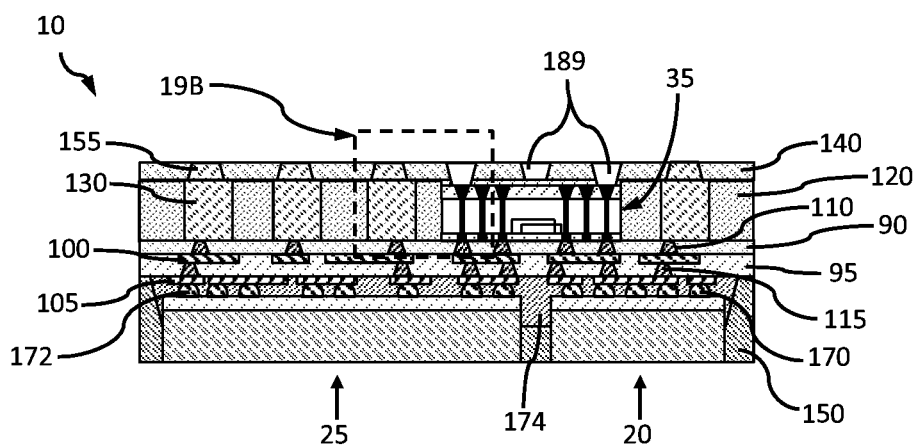
FIG. 19A is a representative cross-sectional view of the assembly of FIG. 18 with the carrier removed, the assembly rotated, and openings formed in an insulating layer to expose one or more of the through substrate vias (TSVs) in the interconnect chip, according to a certain embodiment.

Next and as shown in FIG. 19A, the insulating layer 140 can be processed to form openings 189 therein leading to the conductive pillars 130 in anticipation of the attachment of the solder structures 135. The insulating layer 140 can be greater than 1 micron, greater than 2 microns, greater than 3 microns, greater than 4 microns, greater than 5 microns, greater than 6 microns, or greater than 7 microns thick. The insulating layer 140 can be less than 10 microns, less than 9 microns, less than 8 microns, less than 7 microns, less than 6 microns, less than 5 microns, or less than 4 microns thick. For example, the insulating layer 140 thickness can range from 3 microns to 8 microns, or 2 microns to 5 microns, or 1 micron to 10 microns. Optionally, openings 189 for the subsequently formed vias 188 can be formed by laser drilling or plasma etching techniques. The openings 189 extend through the insulating layer 140 as well as the die attach film (DAF) 77 to expose a TSV. The DAF 77 can be greater than 9 micron, greater than 10 microns, greater than 11 microns, greater than 12 microns, greater than 13 microns, greater than 14 microns, or greater than 15 microns thick. The DAF 77 can be less than 21 microns, less than 20 microns, less than 19 microns, less than 18 microns, less than 17 microns, less than 16 microns, or less than 15 microns thick. For example, the DAF 77 thickness can range from 10 microns to 20 microns, or 9 microns to 15 microns, or 12 micron to 21 microns.

Laser drilling to form the openings 189 can be performed by using an Excimer laser, such as an argon fluoride (ArF) excimer laser (wavelength of 193 nm), a krypton fluoride (KrF) excimer laser (wavelength of 248 nm), a Xenon monochloride (XeCl) excimer laser (wavelength of 308 nm), or a Xenon fluoride (XeF) excimer laser (wavelength of 351 nm). Plasma etching can also be used to form the openings 189 in the insulating layer 140 and the DAF 77. Plasma etching can include a photoresist mask layer for defining the patterns to be etched away and protecting the portions that are not to be etched away. The plasma etching can then form the openings 189.

Note the location of the dashed rectangle 19B in FIG. 19A. The dashed rectangle 19B circumscribes one or more of the vias 110, a portion of the insulating layer 140, a portion of the molding layer 120, a via 155, a conductive pillar 130, one or more TSVs 180, an opening 189 in which a via 188 will be formed, and a small portion of the interconnect portion 70 of the interconnect chip 35.

Figure 19B:
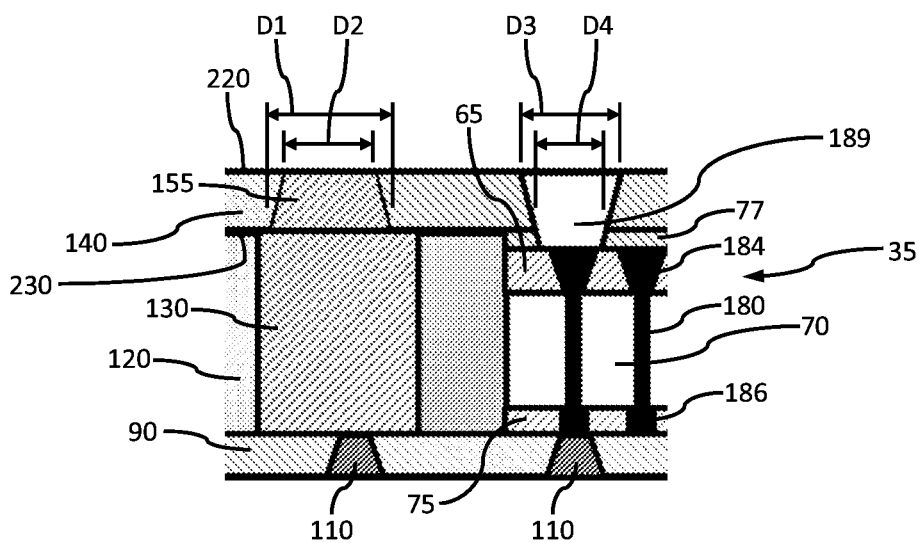
FIG. 19B is a portion of the cross-section view of the assembly of FIG. 19A shown at greater magnification, according to a certain embodiment.

Attention is turned now to FIG. 19B, which is that portion of FIG. 19A circumscribed by the dashed rectangle 19B but shown at greater magnification. As noted above, the opening 189, in which a via 188 will be formed, is positioned in the insulating layer 140. One of the vias 110 is formed in ohmic contact with the conductive stud 186 and is disposed within the dielectric layer 90. Another one of the vias 110 is formed in ohmic contact with the conductive pillar 130 and is disposed within the dielectric layer 90. The conductive pillar 130 is electrically coupled to the via 110 and the via 155 and forms an electrical current path through the structure shown in FIG. 19B.

Additionally, the via 188 (to be formed in the opening 189) is formed in ohmic contact to a respective via 184 in the interconnect chip 35, which is electrically coupled to the conductive stud 186 by the TSV 180. The TSV 180 is electrically coupled to the conductive stud 186, the via 110, the via 184, and the via 188 (when formed) and forms an electrical current path through the structure shown in FIG. 19B, which includes a portion of the interconnect chip 35.

In a certain embodiment, the openings 152 of each via 155 are formed from a side 230 of the insulating layer 140, which is the same side on which the one or more conductive pillars 130 are formed. This can cause a portion of the via 155 at the side 220 of the insulating layer 140 to have a width D2 which is smaller than the width D1 of the portion of the via 155 at the side 230 of the insulating layer 140. However, the openings 189 (in which are formed respective vias 188) are formed from the side 220 of the insulating layer 140. This causes the portion of the opening 189 at the side 220 of the insulating layer 140 to have a width D3 which is larger than the width D4 of the portion of the opening 189 at the side 230 of the insulating layer 140. In a certain embodiment, each of these widths D1, D2, D3, D4 can be diameters, where the openings 152, 189 may be in the form of a tapered opening. The openings 152, 189 can also be non-circular, such as forming an ovoid with a varying diameter at one surface and a varying diameter at the other opposite surface. When the openings are ovoids, then the widths D1, D2, D3, or D4 represent the minor or minimum length of the ovoid.

Therefore, the openings 152 can be formed by laser drilling or other types of etching techniques from one side 230 of the insulating layer 140, while the openings 189 can be formed by laser drilling (or ablating) or other types of etching techniques (e.g., plasma etching) from an opposite side 220 of the insulating layer 140.

Laser drilling or plasma etching via exposure on the insulating layer 140 can provide precise control for via definition (~50 um) or even smaller. The vias 188 over the interconnect chip 35 are in opposite orientation to vias 155 outside interconnect chip 35, and both vias 188 and 155 are within the same insulating layer 140. This process does not require removal of the insulating layer 140 and then recoating the insulating layer 140.

Figure 20:
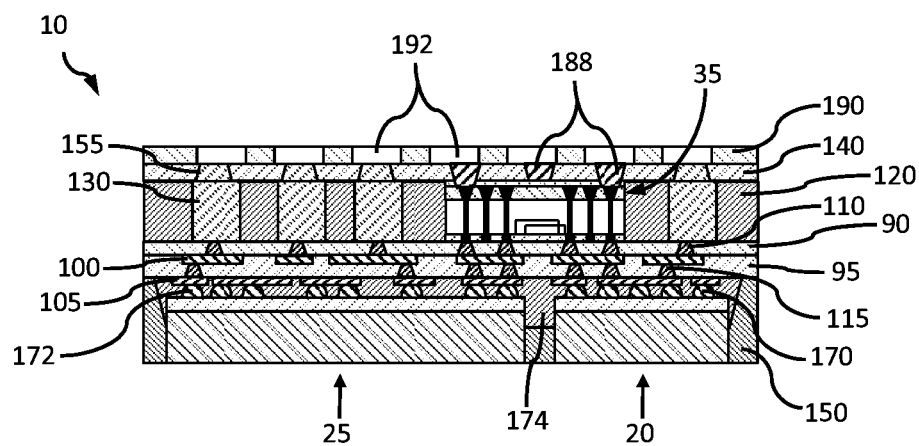
FIG. 20 is a representative cross-sectional view of the assembly of FIG. 19A with a photolithography mask deposited and openings formed in the mask, according to a certain embodiment.

Next and as shown in FIG. 20, the vias 188 are fabricated in the openings 189 using plating or other material deposition techniques. Then, a photolithography mask 190 can be deposited on the insulating layer 140 and patterned photolithographically to produce one or more openings 192, which will be used to plate the conductive pads 157. The photolithography mask 190 can be composed of negative tone or positive tone resist as desired. Please note that a seed layer (not shown) may also be used to support the plating process for forming the conductive pads 157. If a seed layer is desired, then it can be deposited prior to applying the photolithography mask 190. It should be understood that some of the processes for manufacturing the semiconductor chip device 10 may require depositing a seed layer prior to executing the process. If a seed layer is needed, but is not explicitly shown, it should be understood that the seed layer is included in the process.

Figure 21:
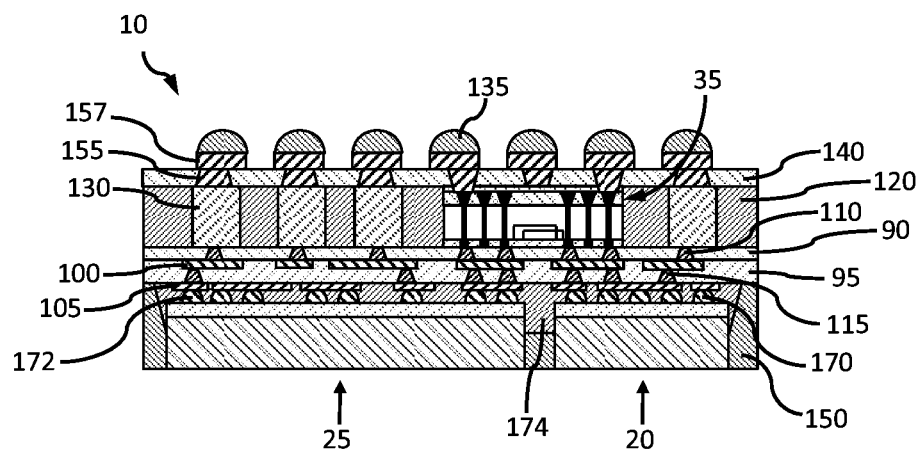
FIG. 21 is a representative cross-sectional view of the assembly of FIG. 20 with a metallization layer deposited to fill the openings formed in the mask and the openings that exposed the ends of the TSVs, and solder structures formed on the portions of the metallization layer remaining after removing the photolithography mask, according to a certain embodiment.

Next and as shown in FIG. 21, with the photolithography mask 190 in place and patterned, a plating process is performed to fabricate the conductive pads 157. The plating process is preferably a biased plating process. Next, the photolithography mask 190 is stripped using ashing, solvent stripping or the like to yield the conductive pads 157 positioned on an opposite side of the insulating layer 140 from the conductive pillars 130. Any portions of a seed layer can be removed, as well. With the conductive pads 157 formed on the insulating layer 140, the solder structures 135 can be attached to the conductive pads 157 by way of pick and place, stencil, or other solder attachment techniques. A reflow can be performed after the initial attachment of the solder structures 135 to solidify the metallurgical bonds there between. At this point, the semiconductor chip device 10 can be mounted on the circuit board 15 as shown in FIG. 1.

Figure 22:
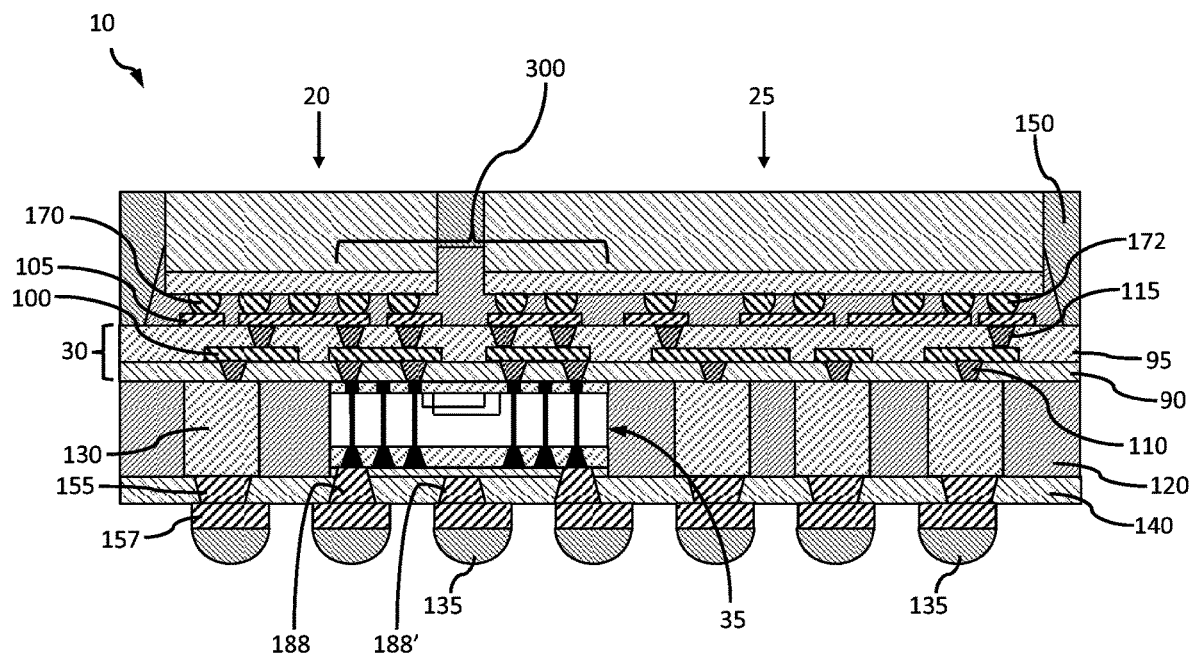
FIG. 22 is a representative cross-sectional view of a semiconductor chip device with an interconnect chip providing external and internal electrical coupling to the semiconductor chips and having an RDL structure with multiple layers, according to a certain embodiment.

Next and as shown in FIG. 22, the semiconductor chip device 10 is flipped over as would be the orientation for mounting to the circuit board 15. It should be understood that more than two semiconductor chips can be packaged in the semiconductor chip device 10 using the same techniques described above, as well as having fewer or more interconnect layers in the RDL structure 30. As can be seen, power can be supplied under the embedded die shadow area 300 that is above the interconnect chip 35. The power (or signals) can be electrically supplied or received through the solder structures 135, the vias and TSVs in the interconnect chip 35, and the vias and pads in the RDL structure 30.

Figure 23:
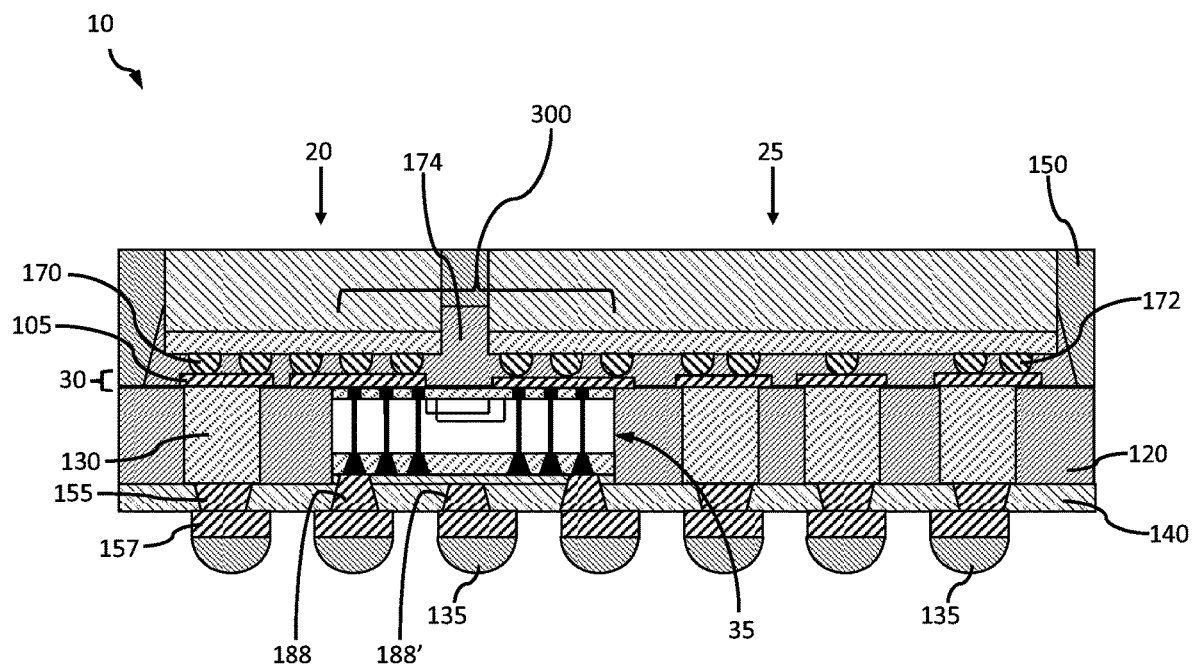
FIG. 23 is a representative cross-sectional view of a semiconductor chip device with an interconnect chip providing external and internal electrical coupling to the semiconductor chips and having an RDL structure with a single layer, according to a certain embodiment.

Next and as shown in FIG. 23, the semiconductor chip device 10 has been fabricated using a process that develops only one metallization layer 105 in the RDL structure 30. As can be seen, the metallization layer 105 has been etched to produce traces that can provide electrical coupling between the solder structures 170, 172, and the TSVs 180 and the conductive pillars 130. Other than the RDL structure 30, the remaining portions of the semiconductor chip device 10 can be fabricated as described above for the similar portions of the semiconductor chip device 10 shown in FIG. 22.

The semiconductor chip device 10 is flipped over as would be the orientation for mounting to the circuit board 15. It should be understood that more than two semiconductor chips can be packaged in the semiconductor chip device 10 using the same techniques described above, as well as having more interconnect layers in the RDL structure 30 (as in FIG. 22). As can be seen, power can be supplied under the embedded die shadow area 300 that is above the interconnect chip 35. The power (or signals) can be electrically supplied or received through the solder structures 135, the vias and TSVs in the interconnect chip 35, and the pads in the RDL structure 30.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any sub-combination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A semiconductor chip device, comprising:
a first molding layer having a first side and a second side opposite the first side;
an interconnect chip at least partially encased in the first molding layer, the interconnect chip comprising a first through substrate via (TSV) that extends through the interconnect chip;
an insulating layer positioned on the first side of the first molding layer;
a first conductive structure that is positioned vertically below the interconnect chip and extends through the insulating layer, wherein the first conductive structure is electrically coupled to the first TSV;
an intermediate conductive structure positioned in contact with a bottom surface of the first conductive structure; and
a first solder structure positioned in contact with a bottom surface of the intermediate conductive structure;
wherein the first conductive structure, the intermediate conductive structure, and the first solder structure are vertically aligned with the TSV extending through the interconnect chip.

2. The semiconductor chip device of claim 1, wherein the insulating layer positioned on the first side of the first molding layer is vertically offset from the first TSV extending through the interconnect chip.

3. The semiconductor chip device of claim 1, wherein the intermediate conductive structure electrically couples the first solder structure to the first conductive structure.

4. The semiconductor chip device of claim 1, further comprising:
a first semiconductor chip positioned vertically above the interconnect chip and proximate the second side of the first molding layer; and
a second solder structure positioned on a bottom-side of the first semiconductor chip and vertically above at least a portion of the interconnect chip such that the second solder structure is over the interconnect chip.

5. The semiconductor chip device of claim 4, wherein the first TSV, the first conductive structure, and the second solder structure are configured to transmit an electrical signal to or from the first semiconductor chip.

6. The semiconductor chip device of claim 5, wherein the electrical signal is a power signal, and the first TSV, the first conductive structure, and the second solder structure are configured to transmit the power signal to the first semiconductor chip.

7. The semiconductor chip device of claim 1, wherein the interconnect chip further comprises a die attach film disposed between the insulating layer and the interconnect chip, and wherein the first conductive structure extends through the die attach film.

8. The semiconductor chip device of claim 1, further comprising:

the interconnect chip comprising a second TSV that extends through the interconnect chip, wherein the second TSV is horizontally spaced away from the first TSV; and
a second conductive structure that is positioned vertically below the interconnect chip and extends through the insulating layer, wherein the second conductive structure is electrically coupled to the second TSV, and wherein the second conductive structure is horizontally spaced away from the first conductive structure.

9. The semiconductor chip device of claim 8, further comprising:
a first semiconductor chip with a second solder structure; and
a second semiconductor chip with a third solder structure, wherein the first TSV, the first conductive structure, and the second solder structure are electrically coupled together and are configured to transmit a first electrical signal to or from the first semiconductor chip, and
wherein the second TSV, the second conductive structure, and the third solder structure are electrically coupled together and are configured to transmit a second electrical signal to or from the second semiconductor chip.

10. The semiconductor chip device of claim 8, wherein:
the first solder structure is positioned vertically below the first conductive structure and electrically coupled to the first TSV; and wherein
a second solder structure is positioned vertically below the second conductive structure and electrically coupled to the second TSV.

11. A process of manufacturing a semiconductor chip device, comprising:
depositing an insulating layer along a first side of an interconnect chip, wherein:
the interconnect chip includes the first side and a second side opposite the first side,
the interconnect chip includes a first TSV extending therethrough, and
the first TSV is electrically coupled to a first semiconductor chip, wherein the first semiconductor chip is closer to the second side of the interconnect chip than to the first side of the interconnect chip;
patterning the insulating layer to define a first opening that extends to the first TSV;
forming a first conductive structure within the first opening in the insulating layer, wherein the first conductive structure is electrically coupled to the first TSV;
disposing an intermediate conductive structure in contact with a bottom surface of the first conductive structure; and
disposing a first solder structure in contact with a bottom surface of the intermediate conductive structure;
wherein the first conductive structure, the intermediate conductive structure, and the first solder structure are vertically aligned with the TSV extending through the interconnect chip.

12. The process of claim 11, wherein the insulating layer positioned on a first side of a first molding layer is vertically offset from the first TSV extending through the interconnect chip.

13. The process of claim 11, wherein:
the interconnect chip includes a second TSV extending therethrough,
the second TSV is electrically coupled to a second semiconductor chip, wherein the second semiconductor chip is closer to the second side of the interconnect chip than to the first side of the interconnect chip;

patterning the insulating layer comprises patterning the insulating layer to define a second opening that extends to the second TSV; and the process further comprises forming a second conductive structure within the second opening within the insulating layer, wherein the second conductive structure electrically couples the second TSV to the second semiconductor chip.

14. The process of claim 11, wherein attaching the first side of the interconnect chip further comprises depositing a die attach film to the first side of the interconnect chip and then attaching the interconnect chip, via the die attach film, to the insulating layer.

15. The process of claim 14, further comprising patterning the die attach film to define a die attach film opening, wherein the forming the first conductive structure comprises forming the first conductive structure within the die attach film opening of the die attach film.

16. The process of claim 11, wherein the insulating layer comprises a third side and a fourth side that is opposite the third side, and wherein the process further comprises:
patterning the insulating layer on the third side to define a second opening, wherein:
the patterning the insulating layer to define the first opening is performed on the fourth side of the insulating layer, and
the patterning of the insulating layer on the third side to define the second opening is performed prior to the patterning of the insulating layer on the fourth side to define the first opening.

17. The process of claim 16, further comprising:
forming a second conductive structure in the second opening prior to forming the first conductive structure in the first opening.

18. The process of claim 16, further comprising:
forming a second conductive structure in the second opening prior to patterning the insulating layer on the fourth side to define the first opening.

19. The process of claim 16, wherein the insulating layer comprises a photoimageable polymer, and wherein the second opening is formed by a photoimaging process and the first opening is formed by laser drilling or plasma etching.

20. The process of claim 16, wherein:
the second opening comprises a first width at the third side of the insulating layer and a second width at the fourth side of the insulating layer,
the first opening comprises a third width at the fourth side of the insulating layer and a fourth width at the third side of the insulating layer,
the first width is larger than the second width, and
the third width is larger than the fourth width.

* * * * *